(12) United States Patent
Gregoire

(10) Patent No.: US 9,173,297 B2
(45) Date of Patent: Oct. 27, 2015

(54) METHOD OF MAKING A THREE DIMENSIONAL CIRCUIT WITH AN IMPRINT TOOL

(71) Applicant: George Gregoire, San Diego, CA (US)

(72) Inventor: George Gregoire, San Diego, CA (US)

(*) Notice: Subject to any disclaimer, the term of this patent is extended or adjusted under 35 U.S.C. 154(b) by 158 days.

(21) Appl. No.: 13/833,830

(22) Filed: Mar. 15, 2013

(65) Prior Publication Data

US 2014/0262444 A1    Sep. 18, 2014

(51) Int. Cl.
| | |
|---|---|
| H05K 3/02 | (2006.01) |
| H05K 3/00 | (2006.01) |
| H05K 1/02 | (2006.01) |
| H05K 3/10 | (2006.01) |
| H05K 3/46 | (2006.01) |

(52) U.S. Cl.
CPC ............ *H05K 3/0014* (2013.01); *H05K 1/0289* (2013.01); *H05K 3/107* (2013.01); *H05K 3/4617* (2013.01); *H05K 2203/0108* (2013.01); *Y10T 29/49156* (2015.01)

(58) Field of Classification Search
CPC ..... H05K 3/0014; H05K 3/02; H05K 1/0284; Y10T 29/49156; Y10T 29/49155; Y10T 29/49124; Y10T 29/49117; Y10T 29/49002
USPC ......... 29/847, 846, 829, 825, 592.1; 174/251; 216/18; 425/385
See application file for complete search history.

(56) References Cited

U.S. PATENT DOCUMENTS

| | | | | |
|---|---|---|---|---|
| 5,334,279 | A | * 8/1994 | Gregoire | ............. B29C 33/3878 156/150 |
| 5,351,393 | A | 10/1994 | Gregoire | |
| 5,390,412 | A | 2/1995 | Gregoire | |
| 5,451,722 | A | 9/1995 | Gregoire | |
| 6,005,198 | A | 12/1999 | Gregoire | |
| 6,460,247 | B1 | 10/2002 | Gregoire | |
| 6,553,662 | B2 | 4/2003 | Sedberry | |
| 8,878,162 | B2 * | 11/2014 | Bradley | ................. B82Y 10/00 257/40 |

* cited by examiner

*Primary Examiner* — Peter DungBa Vo
*Assistant Examiner* — Azm Parvez
(74) *Attorney, Agent, or Firm* — Mark Wisnosky

(57) ABSTRACT

Imprinting tools that include a female master tool and a male working tool are used to create three-dimensional circuits. The female tool is used to create multiple male tools that are metallized and pressed into a substrate transferring the metallization to the substrate. Metallization on prominences of the male tool can be selectively removed to create vias, blind vias, vertical traces and other selectively non-metallized regions for interconnect circuitry. The process is used to create circuitry that includes narrow, high aspect ratio traces having reduced parasitic capacitance to adjacent circuit features.

18 Claims, 16 Drawing Sheets

METHOD OF MAKING A THREE DIMENSIONAL CIRCUIT WITH AN IMPRINT TOOL

CROSS-REFERENCE TO RELATED APPLICATIONS

Not Applicable.

BACKGROUND OF THE INVENTION

1. Technical Field

The present invention relates to a method to manufacture high aspect ratio traces, tools used in the method and electronic circuit structures created with such traces.

2. Related Background Art

Manufacturers of popular portable electronic equipment such as cell phones and personal computers have placed enormous stresses on the interconnect industry. Hybrid circuit and printed circuit board (PCB) customers continue to demand smaller form factors, higher performance and more features. The two primary forces driving these requirements are the continued increase of semiconductor density and cost. Consequently, there is pressure on the interconnect industry to provide: 1) finer geometries (10 µm and below), 2) better line width control, 3) thinner dielectrics, and 4) better electrical performance. Process costs need to be lower than current high-density solutions. Additionally, entry barriers for the production processes necessary to achieve these requirements should be low and allow smaller manufacturers to produce high-quality and high-density substrates, preferably using existing equipment and manufacturing processes.

Imprint patterning presents an elegant solution to the contradictory requirements of high performance and low entry barriers. Imprint patterning replaces alternative and more expensive photolithography and laser drilling processes with a simple and cost-effective microreplication step. It produces features for all circuit traces and interconnect vias for a particular layer simultaneously. It avoids the masking and registration steps in conventional PCB manufacturing processes that contribute to density constraints and scrap. Importantly, it can be implemented in virtually any printed circuit shop with minimal additional equipment and process development expense. The basic tools and methods for imprint patterning of PCBs are described in U.S. Pat. Nos. 5,334,279; 5,390,412; 5,451,722; 6,005,198; 6,460,247 and RE38,579; all by the inventor and all hereby incorporated by reference.

Although imprint patterning produces interconnect circuits at lower cost and with higher circuit density, it has heretofore resulted in a typical multilayer structure having low aspect ratio traces (wider than they are tall) that produce large parasitic capacitances between traces on different layers or between traces and ground or power planes. These parasitic capacitances limit electronic performance of the assembled circuitry in that they provide unintended spurious signal coupling paths between isolated traces that can cause excessive system noise or cause excessive capacitive loading of sensitive circuits that can slow down operating waveforms.

Prior attempts to reduce these performance limiting parasitic capacitances have involved reducing trace dimensions while increasing interlevel dielectric thicknesses. Unfortunately, as experienced similarly in the semiconductor industry, these measures result in adding expensive, special purpose processes that add significantly to the cost of the product, while simultaneously erecting significant entry barriers in the form of new equipment capitalization costs.

Therefore, it is desirable to provide a new and improved imprint patterning process for PCBs and other interconnect circuits that includes the ability to fabricate high aspect ratio traces (taller than they are wide) having particularly narrow widths compared to and in addition to conventional imprinted traces.

DISCLOSURE OF THE INVENTION

Embodiments are described for imprinting tools, processes for making such tools, circuitry and processes for making such circuitry using the imprinting tools. The tools and circuitry are described as being incorporated into exemplary circuit manufacturing processes and the resultant circuitry. Those skilled in the art will recognize that the same techniques are applicable to a wide range of interconnect circuitry. Examples include printed circuit boards, hybrid microcircuits fabricated using low temperature co-fired ceramic (LTCC) materials and thin film microcircuits such as those used in the construction of thin film display devices, including those having touch-screen sensors.

In its simplest embodiment a two-level imprinting tool coated with a layer of conductive material is formed for each interconnect layer. Conventional CAD systems currently used for designing interconnect such as printed circuit design data can be used. The conductive material is applied over a release layer such that the conductive material may be transferred to a circuit device during a lamination process. The conductive material is applied over selected areas of the imprinting tool using pattern plating techniques. In another embodiment conductive material is applied through a process of panel plating and selectively removing conductive material from protruding structures or prominences on the imprinting tool through a buffing or burnishing process. In another embodiment the imprinting tool is made using a process of panel plating, followed by a print and etch process to selectively remove conductive material. Imprinting tools for the outer layers are inserted at the multilayer or build-up layer lamination step adjacent to the separator sheets. After lamination of the outer layers or build-up layers, the dielectric has recesses or indentations for traces and vias that are coated with conductive material. A standard desmear process removes dielectric material at the bottom of the vias for subsequent metallization and completes an electrical connection from one layer to another. In one embodiment the prominences on the imprint tool are ridges, which correspond to traces in the circuit design. Ridges produces indentations shaped as grooves in the imprinted circuit. The metalized grooves result in high aspect ratio traces in the finished circuit. In another embodiment the prominences on the imprint tool are cylindrical, which correspond to pads or locations for through holes in the circuit design data. Cylindrical prominences on the imprint tool result in indentations shaped as holes or pits in the imprinted circuit and result in microvias in the finished circuit. Throughout this specification grooves and vias can be taken to also mean more generally indentations. The word "indentations" refers to an imprinted feature that may have a variety of geometric shapes.

The conductive material removed from the protruding structures on the imprinting tool corresponds to the conductive material that would otherwise be deposited at the bottom of the imprint. Thus, conductive material is only transferred to the side walls of the imprint resulting in a nearly vertical microtrace having a width determined by the thickness of the conductive material film and a height determined by the depth of the imprint. Such high aspect ratio microtraces exhibit much smaller parasitic capacitance to other horizontal traces and to ground or power planes.

Embodiments are shown that allow use of the vertical traces both as interconnect in a single layer and interconnect between layers. Interconnect between layers are also referred to as vias. In one embodiment an imprinting tool having three or more layers is used to provide multilevel interconnect design possibilities.

In another embodiment pairs of vertical traces are produced for each trace in the conventional design data file. The paired traces provide redundant interconnects for each trace.

In another embodiment vertical traces are layered to produce an XY grid of traces on two levels. Methods are shown to selectively interconnect the traces on the two levels at their intersection point.

The use of microtraces with conventional traces and vias as well as the usual ground and power planes found in multilevel printed circuit boards leads to a set of circuit elements having unique electronic properties. Embodiments include transmission lines and shielded interconnections and x-y grids for touch-screen devices.

BRIEF DESCRIPTION OF THE DRAWINGS

FIG. 1 is a schematic view of an initial step of making a circuit imprint tool of FIGS. 3 and 3a.

MODES FOR CARRYING OUT THE INVENTION

Figure 17:
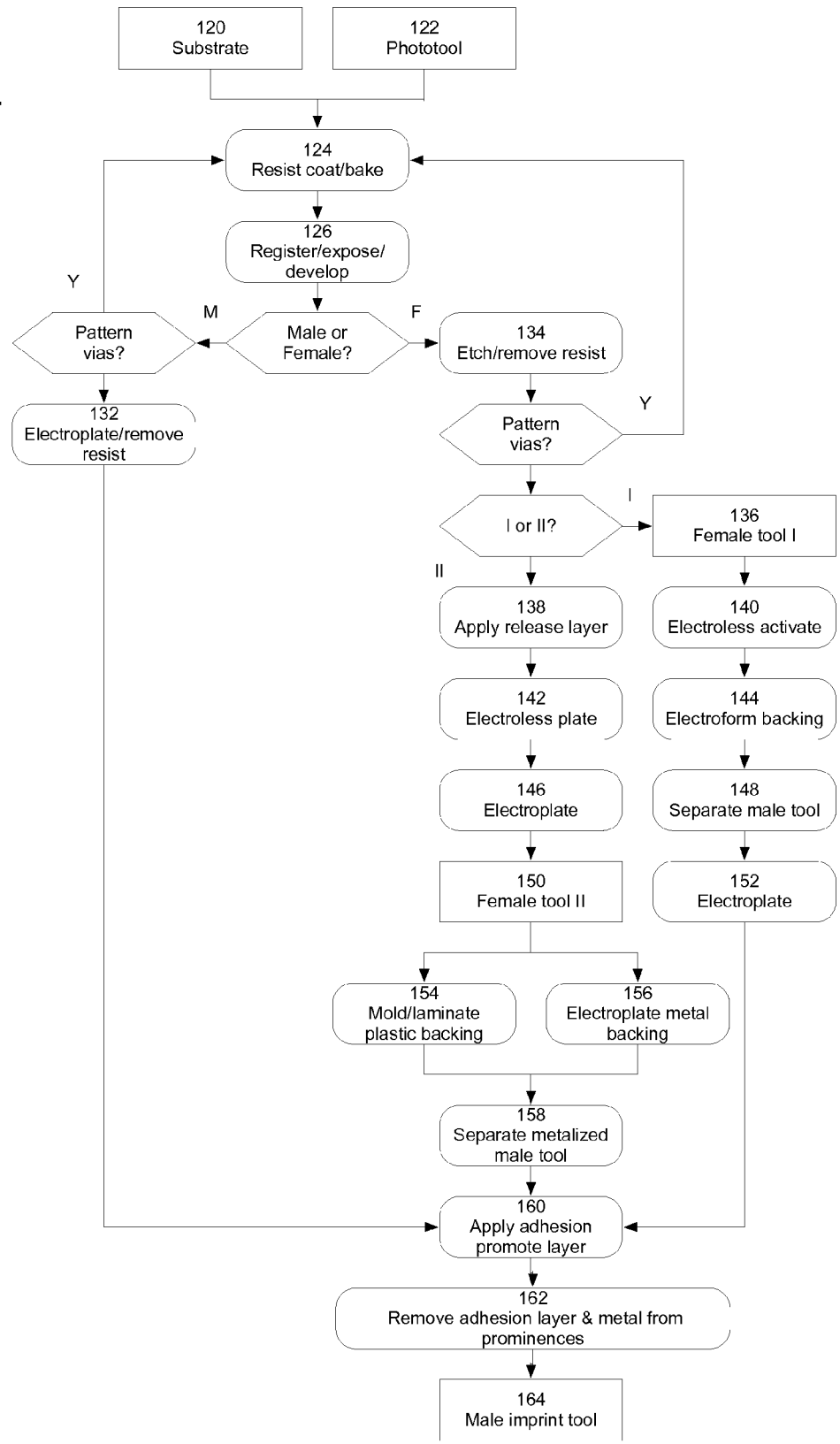
FIG. 17 is a flowchart showing the steps in the process of creating a circuit imprint tool.
Figure 18:
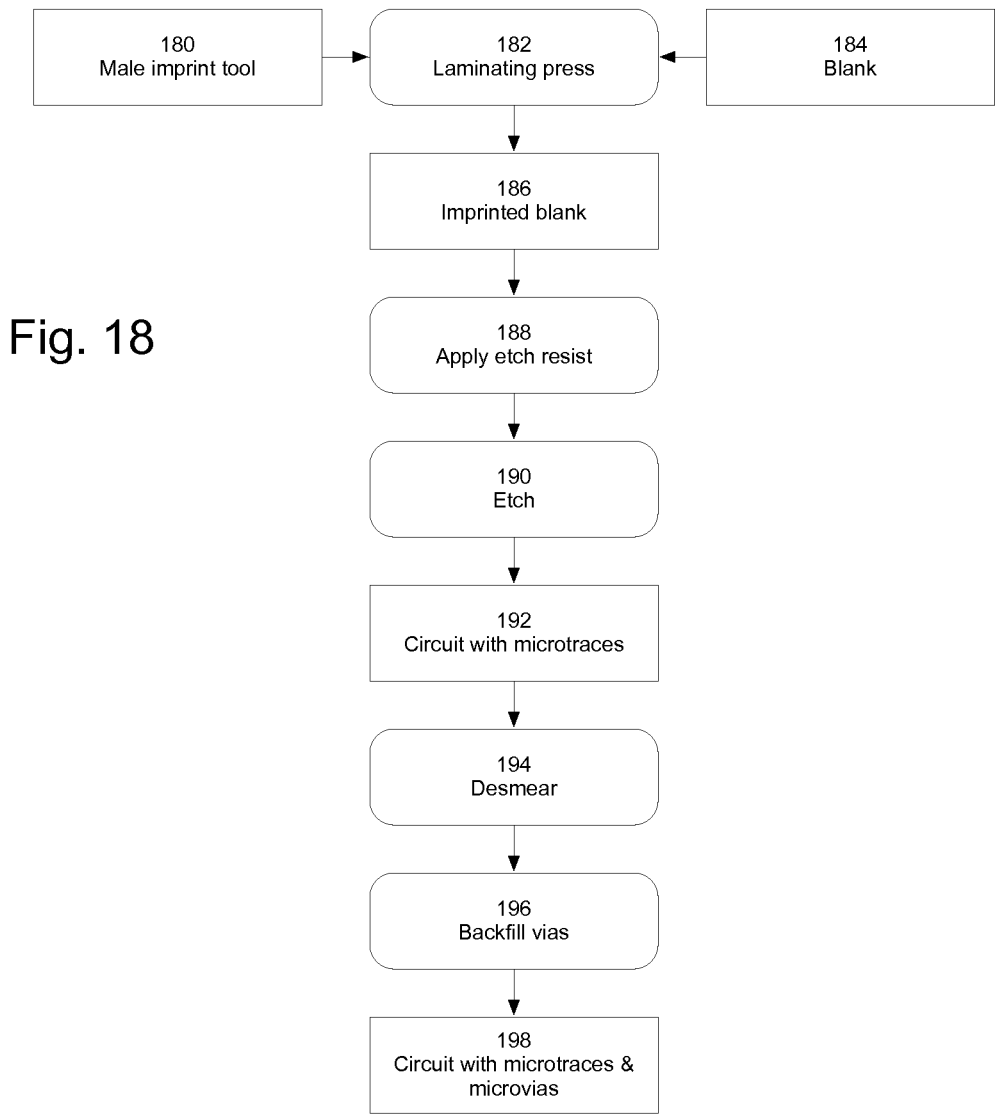
FIG. 18 is a flowchart showing the steps in the process of creating a three dimensional circuit.

The process used to fabricate the female imprint tool master and the male imprint tools are illustrated in the flow chart of FIG. 17 and embodiments that include creating circuits are illustrated in FIG. 18. In all following discussions, reference numbers enclosed in parentheses refer to the flow charts.

Figure 3:
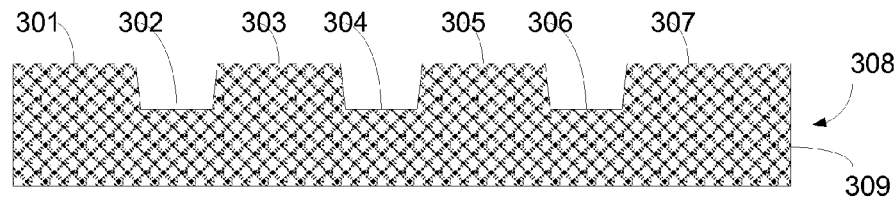
FIG. 3 is a cross-sectional view of a circuit imprint tool master that is constructed in accordance with the present invention.

Referring now to the drawings, and more particularly to FIG. 3, there is shown a circuit imprint tool master 308 which is constructed in accordance with the present invention. The circuit imprint tool master 308 generally comprises a plate 309 having a set of valleys or grooves such as grooves 302, 304, 306 interleaved between a plurality of spaced apart flat portions 301, 303, 305. The tool 308 is configured in substantially the same shape as the circuit to be imprinted discussed below. The circuit imprint tool master 308 is constructed and utilized as described herein to make a three dimensional circuit having a plurality of sunken conductive pads or traces.

Figure 3A:
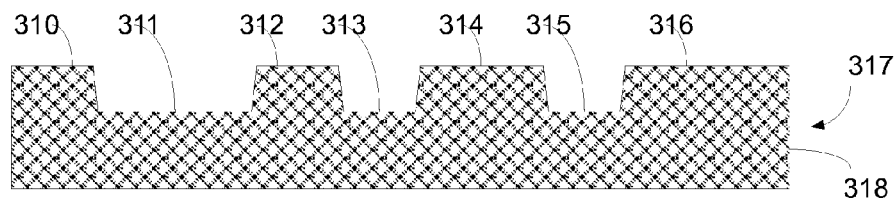
FIG. 3a is a cross-sectional view of an intermediate step in making a 3-level circuit imprint tool master.
Figure 3B:
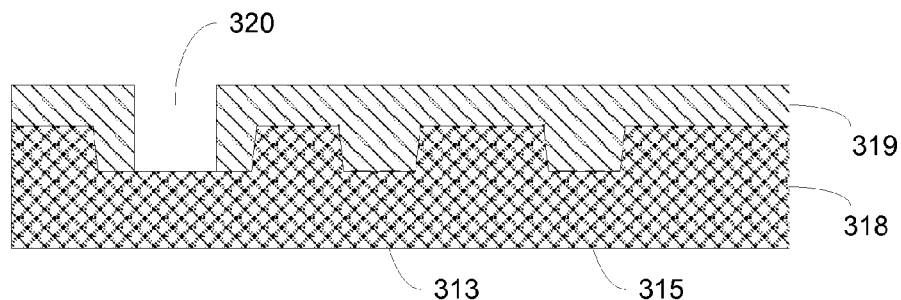
FIG. 3b is a cross-sectional view of a second intermediate step in making a 3-level circuit imprint tool master.
Figure 3C:
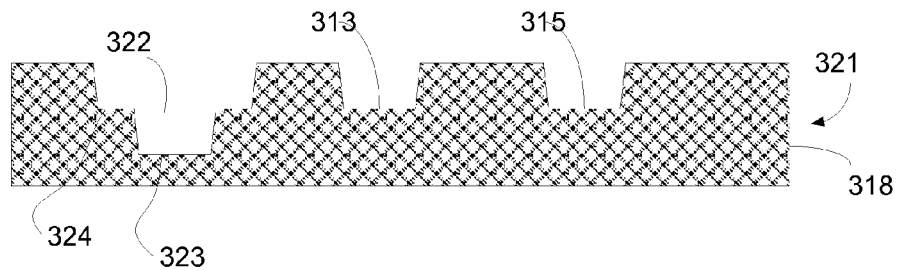
FIG. 3c is a cross-sectional view of a 3-level circuit imprint tool master that is constructed in accordance with the present invention.
Figure 11:
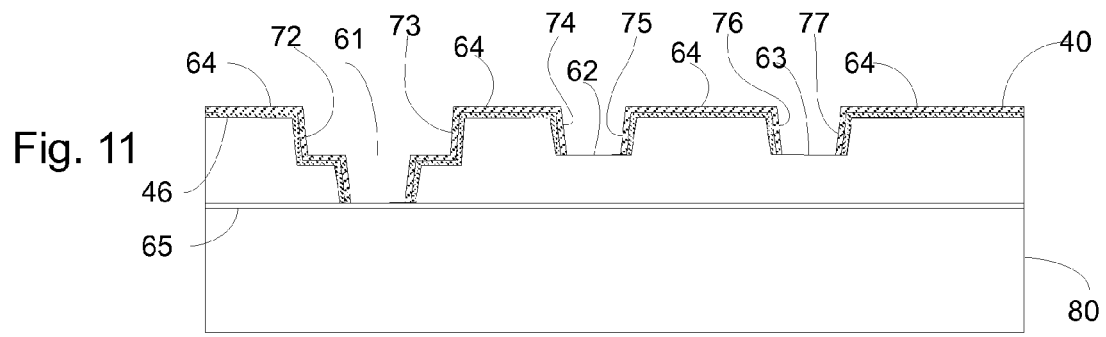
FIG. 11 is a cross sectional view of an imprinted circuit substrate after removing the circuit imprint tool.
Figure 12:
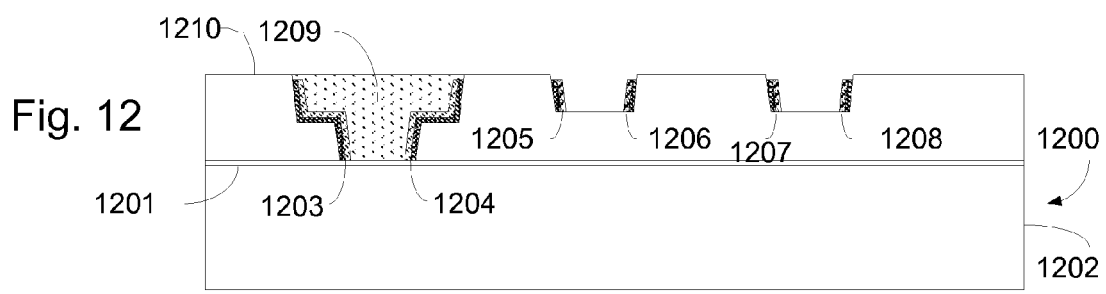
FIG. 12 is a cross sectional view of circuit embodiments constructed in accordance with the present invention.
Figure 12A:
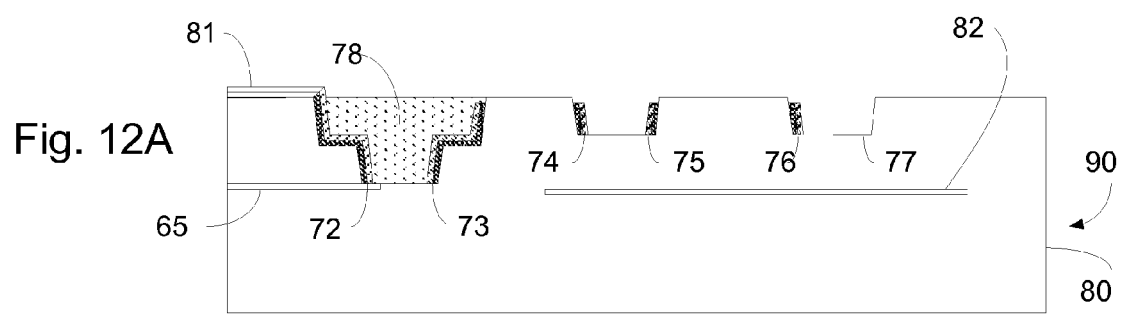
FIG. 12a is a cross sectional view of additional circuit embodiments constructed in accordance with the present invention.

In another embodiment, FIG. 3c, there is shown a multiple level circuit imprint tool master 321 which is constructed in accordance with the present invention. The circuit imprint tool master 321 generally comprises a plate 318 having a set of valleys or grooves such as grooves 322, 313, 315 interleaved between a plurality of spaced apart flat portions. In one embodiment the grooves include single level grooves 313, 315 as described above in conjunction with FIG. 3. In another embodiment the grooves 322 are comprised of multiple levels. In the example shown the groove consists of levels 323, 324 each providing additional interconnect options to those provided by the single level 313, 315 grooves. The circuit imprint tool master 321 is configured in substantially the same shape as the circuit to be manufactured using an imprint tool, described below, manufactured from the imprint tool master 321. In one embodiment prominences on the circuit imprint tool correspond are ridges, which when imprinted produces indentations that are grooves in the imprinted circuit. Such grooves correspond to traces in the circuit design. In another embodiment, prominences on the circuit imprint tool are cylindrical shapes, which when imprinted produce indentations that are pits in the imprinted circuits. Such pits correspond to through-hole or via locations in the circuit design. By way of example, FIGS. 11, 12 and 12a depict circuits, discussed more fully below, that may be created using an imprint tool made from the imprint tool master 321. The circuit imprint tool master 321 is constructed and utilized to create a circuit imprint tool and subsequently multi-level interconnect circuits 1203, 1210, 1211 1206, 1208, 74, 75,76 as described herein having a plurality of sunken conductive pads or traces including both horizontally and vertically oriented interconnect features.

Figure 1:
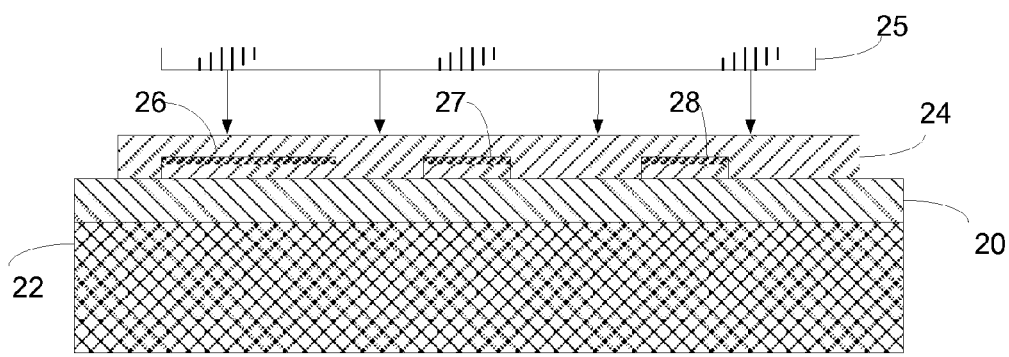
Figure 2:
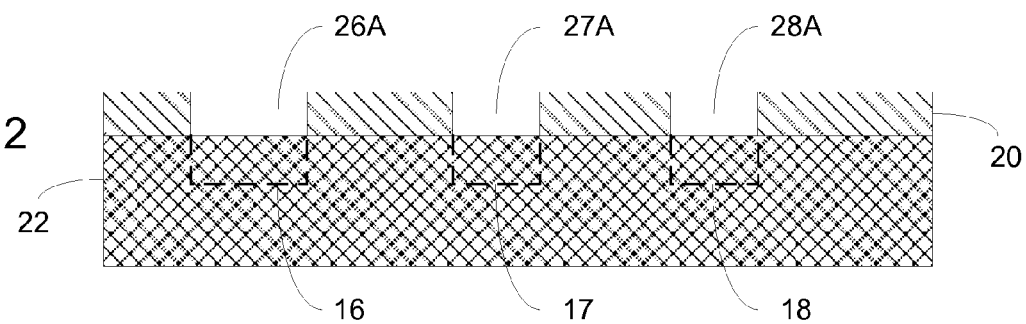
FIG. 2 and FIG. 2a are a schematic views of a second step of making the circuit imprint tool of FIGS. 3 and 3a, respectively.

The method of making the circuit imprint tool master is illustrated in FIGS. 1, 2, 3 and the flow charts of FIGS. 17 and 18. The numbers in parenthesis refer to the numbered steps in the flow charts of FIGS. 17 and 18.

Considering now the initial step of making the circuit imprint tool 308 with reference to FIG. 1. In one embodiment a coating of "photoresist" 20 is applied (124) to the top surface of a plate of etchable material 22 (120). In the preferred embodiment an etchable copper plate is used, those skilled in the art will understand that other etchable or ablatable materials such as other metals, semiconductors, plastics and ceramic materials may be utilized. The plate 22 is dimensioned to accommodate a photo tool 24 (122) of the interconnecting traces required for a given circuit layout. The photoresist 20 is applied to the plate of copper 22 using conventional techniques known in the art, by either coating the plate 22 in photoresist or by spraying the photoresist material onto the top surface of the plate 22. Dry-film photoresist application techniques are another alternative.

As best seen in FIG. 1, after the photoresist 20 has been applied on the surface of the plate 22, the photo tool 24 is registered or positioned on the coated top surface of the plate 22. Next, the assembly is exposed (126) to a light, such as a high intensity ultraviolet or laser light 25 for a sufficient period of time to expose and solubilize portions of the photoresist 20. In this regard, a set of emulsion areas 26-28 on the photo tool 24 protect the select regions photoresist 20 from exposure by blocking the ultraviolet light 25. Those areas of photoresist 20 protected from the ultraviolet light 25 are removed or developed out leaving a plurality of windows of photoresist, such as the windows 26A-28A, within the photoresist material 20; FIG. 2. In other embodiments such windows may be formed by a developing solution, laser cut, ablation or other suitable techniques.

The photo tool 24 is then removed from the top surface of the plate 22. The plate 22 is then placed in an etcher (not shown) which dissolves the exposed copper 16, 17, 18 (134). It should be understood that either a positive or negative imaging technique can be used for preparing the plate 22 for etching as will be described hereinafter.

In one embodiment an etching apparatus (not shown) sprays an etchant onto the surface of the plate 22, via the windows 26A-28A, to remove etchable plate material. Non-limiting exemplary etchant solutions for the preferred embodiment of a copper plate include ferric chloride, cupric chloride, and peroxide sulfuric. As material is removed from the plate 22 a series of grooves or depressions, such as the grooves 302, 304, 306 in FIG. 3 are formed in the plate. Residual photoresist material on the surface of the substrate is then dissolved and removed resulting in the female circuit imprint tool master 308 shown in FIG. 3.

Figure 2A:
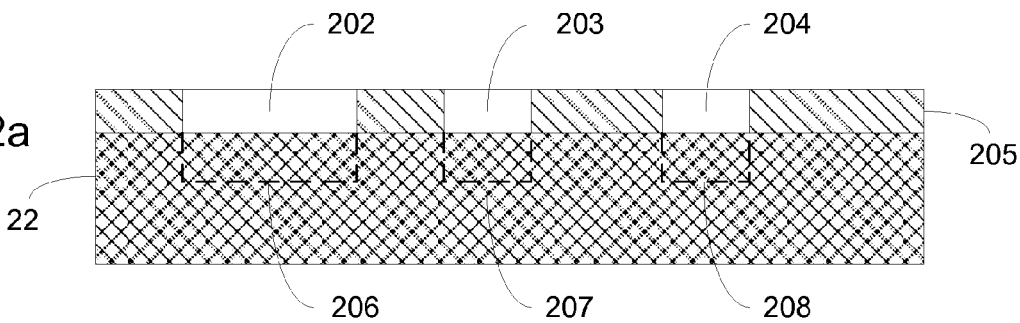

In another embodiment a multilevel circuit imprint tool master is made that provides both traces and interconnect microvias between a plurality of layers of a multi-level circuit. A first lithography and etch step as described in conjunction with FIGS. 1 and 2a above produces an intermediate imprint master tool 317 as shown in FIG. 3a. A second photolithography process (124, 126) is accomplished using a separate pattern for the additional level in the master tool. As seen in FIG. 3b, the substrate 318 now with a first set of grooves is further coated with photoresist 319 and the photo resist is imaged as described earlier to produce selectively both filled grooves 313, 315 and grooves where a portion of the groove 320 is open to etching or ablation in a subsequent step. A second etch step (134) then provides the deeper depressions 322. The multilevel imprint tool master 321 seen in FIG. 3c is seen to consist of a substrate 318 into which are now etched both single level grooves 313, 315 and multi-level grooves 322. In the example shown the groove has a deeper level 323 and an intermediate level 324 both of which may be used to provide interconnect levels as either microvias connecting one level to the next or vertical microtraces on a plurality of levels within the circuit device.

Considering now the female circuit imprint tool masters 308, 321 in greater detail with reference to FIGS. 3 and 3c respectively, the female circuit imprint tool master 308, 321 (136) is a finished product tool that may be used many times for forming a large number of male circuit imprint tools, such those shown in FIGS. 6, 6a and 9, 9a. Methods of making a male circuit imprint tool from the female circuit imprint tool master are illustrated in FIGS. 4 to 9.

Figure 4:
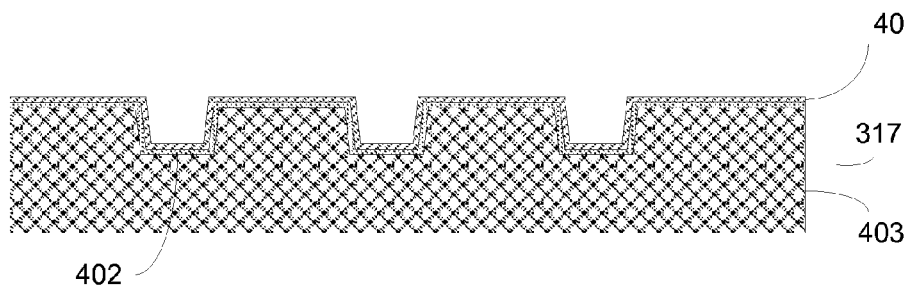
FIG. 4 is a schematic view of a female circuit imprint tool master.
Figure 4A:
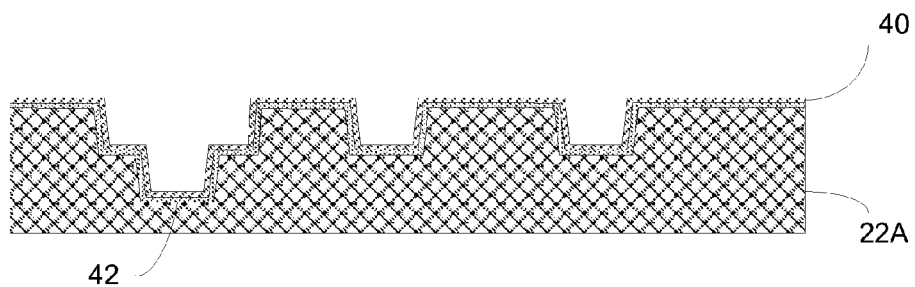
FIG. 4a is a schematic view of a female 3-level circuit imprint tool master.

With reference to FIGS. 4 and 4a, in one embodiment, the process is initiated by spraying the female master tool 317 with a thin coating material 402, 42 (138). In the preferred method, the preferred coating material 402, 42 is an electrically conductive release layer comprising silver, a graphite material or a surface passivation. Those skilled in the art will understand that other coating materials may be utilized such as a low adhesion bathing solution of water and copper sulfate. In this regard, a sufficient quantity of coating material 402, 42 is adhered to the surface of the circuit imprint tool 317 to form a coated tool having a low adhesion bonding surface. In one embodiment, shown in FIG. 4, the imprint tool includes two layers. In another embodiment, shown in FIG. 4a, the circuit imprint tool comprises more than two layers.

The coated tool is then subjected to an optional electroless (142) deposition process followed by an electroplating (146) process, such as an electrolytic process. In this regard, the electrolytic process causes a thin layer or coating of conductive material deposited on top of the electrically conductive release layer 402 to form the conductive material transfer layer 40. Those skilled in the art will understand that platable conductive materials such as copper, nickel, gold and indium tin oxide can be used to form the conductive material layer. The conductive material transfer layer 40 is then coated with an adhesion promoting layer (not shown) such as a dendritic oxide.

Figure 5:
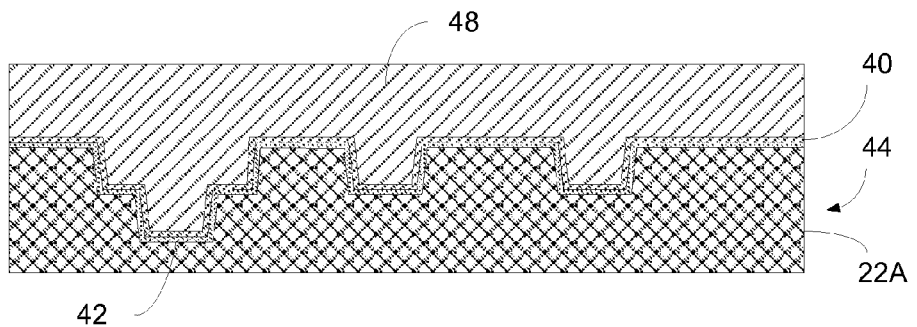
FIG. 5 is a cross sectional view of a male 3-level circuit imprint tool illustrating the male circuit imprint tool formed against a female circuit imprint tool master.

Next, a combination or assembly 44 as shown in FIG. 5 results from forming a backing 48, which is molded or laminated (154) to the exposed top surface of the coated conductive material transfer layer 40. In one embodiment the backing 48 is a thermoplastic polymeric material molded to the conductive material transfer layer 40. Nonlimiting examples of the thermoplastic include material selected from the group of polyethersulphone, polyetherimide, polybutylene terephthalate (PBT), and polyether ether ketone (PEEK). In another embodiment a thermoset material is used. Nonlimiting examples of thermoset material include epoxy thermoset polyetherimide, or a polyester based composite of said thermoset plastic. In another embodiment the backing material may be metallic. In another embodiment a ceramic backing material is used. The backing 48 helps to rigidify the thin conductive material transfer layer 40. FIG. 5 shows a multilevel imprint tool master and imprint tool being formed thereon. Formation of a two level imprint tool from a two level imprint tool master as pictured in FIG. 4 would be used equivalently for a two level imprint tool but is not shown. Once separated the backed male circuit imprint tool 50 (FIGS. 6 and 6a) is formed by removing mechanically and separating it the female tool 22a from the combination 44 (158) (FIG. 5). The electrically conductive release layer 42 has such a sufficiently low adhesion strength, that the male imprint tool 50 and the female tool 317, 22a may be separated mechanically in a relatively facile manner.

In another embodiment the male imprint tool 50 is formed of nickel with a conductive material transfer layer by an electroforming process (156). In this regard, the process is as described earlier except a nickel backing, not shown, replaces the backing 48 and is formed by an electroplating process to the conductive material transfer layer 40.

Figure 5A:
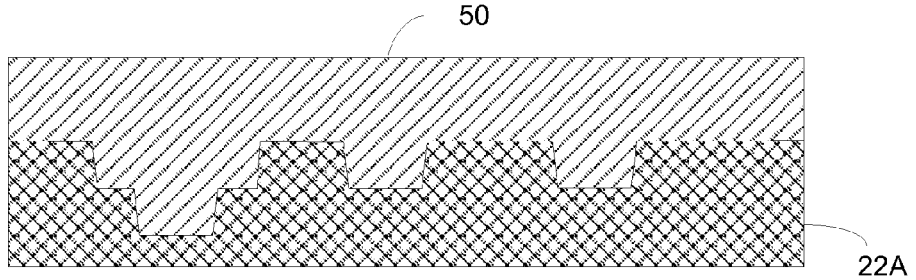
FIG. 5a is a cross sectional view of a male 3-level circuit imprint tool electroformed against a non-metalized female circuit imprint tool master.
Figure 6:
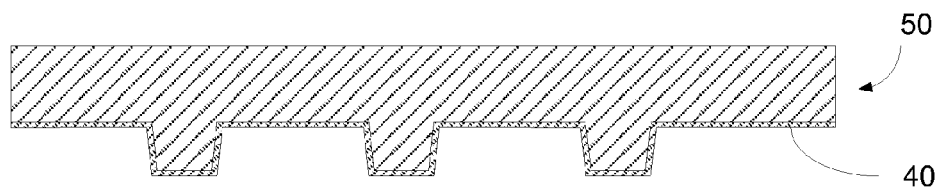
FIG. 6 is a cross sectional view of a male circuit imprint tool after releasing it from the female circuit imprint tool master.
Figure 6A:
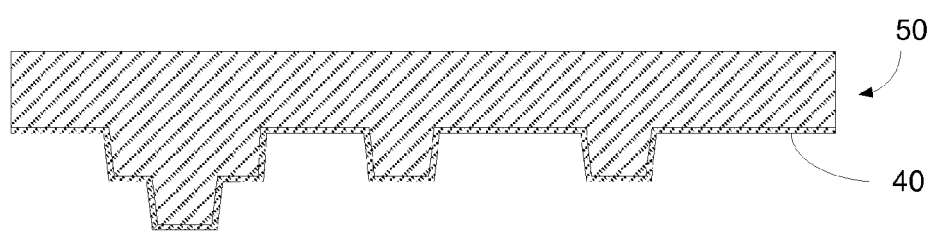
FIG. 6a is a cross sectional view of a 3-level male circuit imprint tool after releasing it from the female circuit imprint tool master.

In another embodiment the male imprint tool 50 is formed directly on the female tool 321 (FIG. 3c) by applying an electroless activating step (140) to the female tool followed by electroforming a male tool 48 (144) onto the female circuit imprint tool master 22a to form the assembly shown in FIG. 5A. The male tool may then be removed from the female imprint tool master (148). The conductive material transfer material 40 is then further applied (152) onto the male imprint tool. The resultant male circuit imprint tool is the same as shown in FIGS. 6 and 6a.

While in the preferred embodiment of the present invention an electroplating process was described for forming the conductive material transfer layer 40 on the imprint tool and the imprint tool master, it will be understood by those skilled in the art that other techniques can be employed such as electroless plating, vapor deposition and metal flame spraying.

Figure 7:
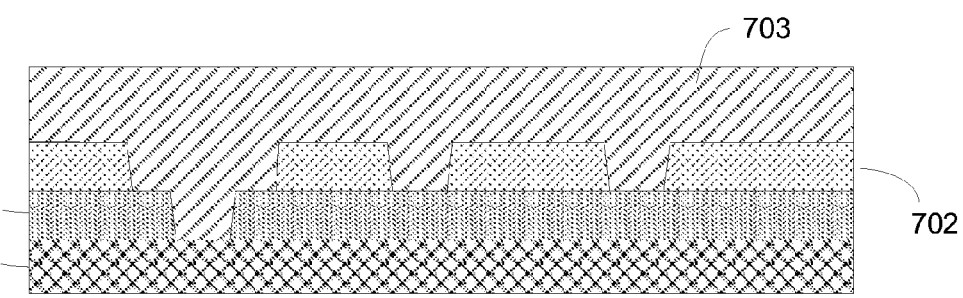
FIG. 7 is a cross sectional view of a male circuit imprint tool being constructed in accordance with one embodiment of the present invention.

A further embodiment is shown in FIG. 7 wherein the female circuit imprint tool master is directly formed photolithographically on a planar substrate 700. In one nonlimiting embodiment a multilayer female circuit imprint tool master is formed from separate layers of photoresist 701, 702 using unique phototools for each layer. The layers are formed sequentially upon the substrate 700 in separate photolithographic steps. The process is the same as described above for preparation of the female tool (124,126) but rather than etching the substrate to form a female imprint tool master, the form of the circuit imprint tool master is built up of photoresist and the male tool is then formed thereon, a metal circuit imprint tool 703 may be formed thereon using either electroforming or electroplating (132) through the openings in the photoresist. After forming, the male circuit imprint tool is removed from the substrate and coated with the transfer conductive material layer 40 using techniques already described.

In another embodiment (not shown) the male circuit imprint tool is formed directly in a blank of mold material using a photolithographic print and etch process similar to that used to form the female imprint tool master.

Figure 8:
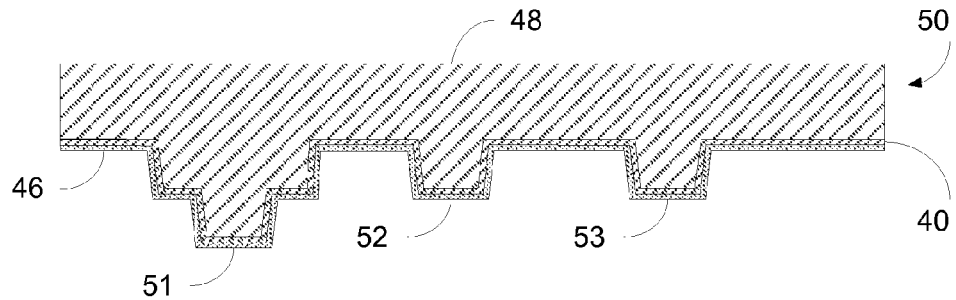
FIG. 8 is a cross sectional view of a male circuit imprint tool which is constructed in accordance with the present invention, illustrating the male circuit imprint tool with a conductive material layer and an adhesion layer.
Figure 10:
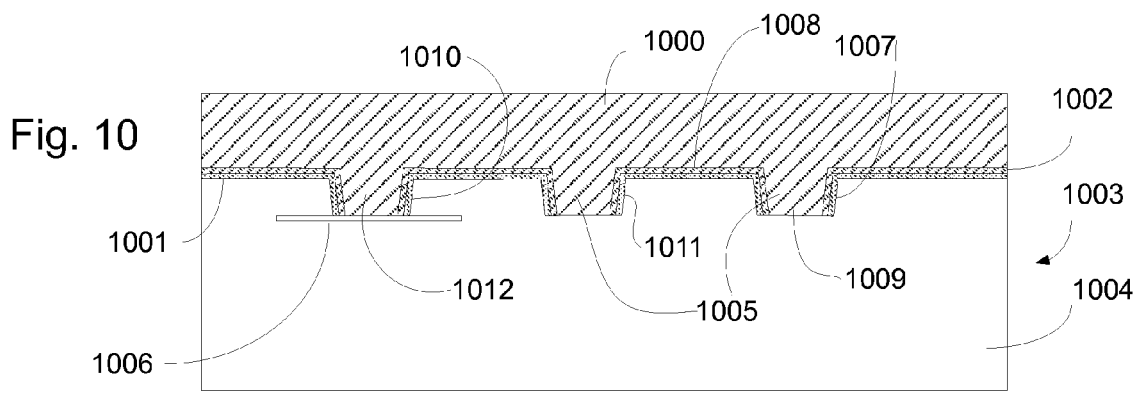
FIG. 10 is a cross sectional view of making a circuit by imprinting a substrate with a male circuit imprint tool.
Figure 10A:
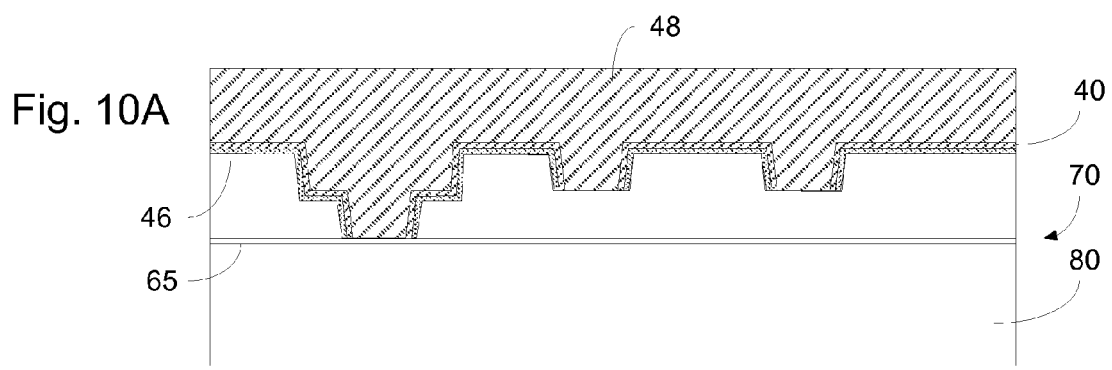
FIG. 10a is a cross sectional view of making a circuit by imprinting a substrate with a 3-level male circuit imprint tool.

In one embodiment as seen in FIG. 8, the inventive method continues by applying a thin layer of adhesion promote coating 46 (160) on the surface of the conductive material transfer layer 40 of the male circuit imprint tool 50. In one embodiment the adhesion promote coating 46 is formed by bathing the tool 50 in a water base oxidizing bath to form a highly adherent dendritic oxide coating on the conductive material transfer layer 40. This wet chemical oxidation treatment prepares the conductive material transfer layer 40 for lamination to the substrate 80 (FIG. 10).

Figure 9:
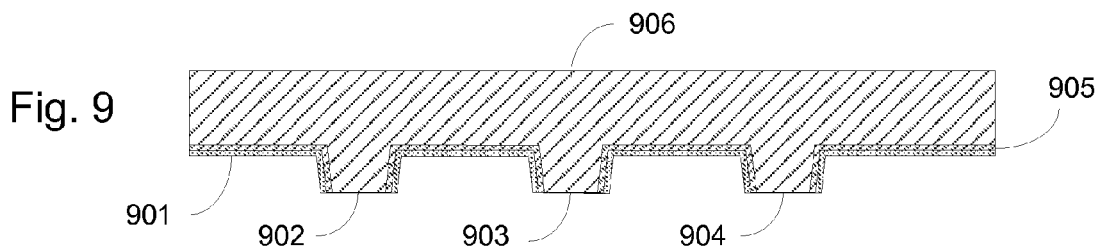
FIG. 9 is a cross sectional view of a male circuit imprint tool in which the conductive material and adhesion layers are removed at the prominences of the male circuit imprint tool.

In another embodiment the preparation of the male circuit imprint tool 906 is completed by removing the conductive material transfer layer 905 and adhesion layer 901 at the prominences of the circuit imprint 902, 903, 904 (162) as shown in FIG. 9. Such removal can be accomplished using standard manufacturing processes such as mechanical abrasion, buffing or chemical etching. In another embodiment the conductive material transfer layer is selectively removed from the prominences by a photolithographic print and etch process. Thereby some of the prominences will have the conductive material removed as shown in 902-904 and other prominences, not shown, will still be coated with the conductive material transfer layer.

Figure 9A:
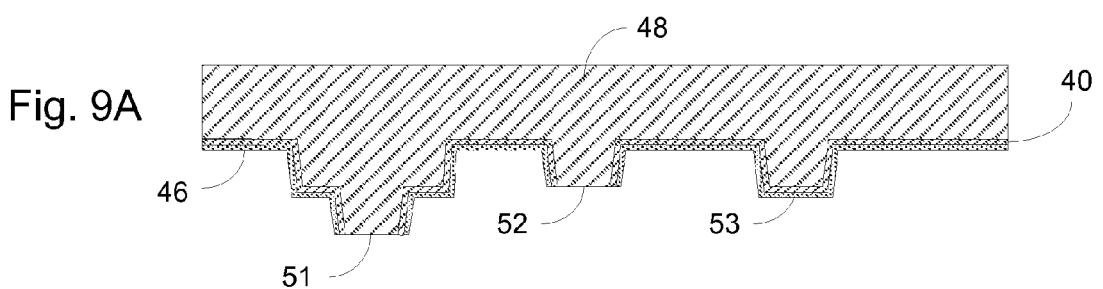
FIG. 9a is a cross sectional view of a multilevel male circuit imprint tool in which the conductive material and adhesion layers are removed at the prominences of the male circuit imprint tool.

In other embodiments shown in FIG. 9a a multilayer male imprint tool 48 is prepared by removing the conductive material transfer layer 40 and the adhesion promoting coating 46 selectively from prominences on the circuit imprint tool. As shown the conductive material transfer layer has been removed from two of the prominences 51, 52 and remains on the prominence 53.

A nonlimiting example of the process used to realize circuits containing microtraces and microvias is illustrated in the flowchart shown in FIG. 18 and is discussed in detail below, where reference numbers enclosed in parentheses refer to the flow chart.

When the conductive material transfer layer 40 has been coated with an adhesion promotion layer 1001 such as a dendritic oxide, the tool 1000 (180) is placed upon an uncured deformable circuit substrate 1004 in a high heat deflecture plastic molding machine, such as a laminating press (182) used in making multi-layer circuits (not shown) which under heat and pressure causes a blank 1003 (184) to be formed as shown in FIG. 10. Nonlimiting examples of the circuit substrate materials include thermoplastic polymeric material, thermoset material, or uncured ceramics. The conductive material transfer layer 1002 is laminated with the adhesion promotion layer 1001 to the circuit substrate 1004. The conductive material transfer layer is transferred from the circuit imprint tool 1000 to the substrate 1004 creating a conductive material layer both on the surface 1008 of the substrate as well as on the walls 1005 of the grooves formed from the prominences 1009 of the circuit imprint tool. The circuit imprint tool 1000 may then be removed from the substrate 1004 leaving a substrate similar to that shown in FIG. 11 (186). In another embodiment the substrate may consist of both a cured and uncured layers such as used in conventional multilayer printed circuit board manufacturing. Surfaces of the cured layers may include conductive material such as traces of an inner layer of a printed circuit board. In this embodiment the circuit imprint tool is placed upon an interposed uncured prepreg layer atop the cured inner layer. Selected prominences 1012 of the circuit imprint tool may be aligned with conductive material of the inner layer 1006 thereby aligning the resultant vertical conductive material 1010 with the conductive material 1006 providing a means for creating a micro via creating a connection from the surface to an interior layer of the resultant circuit.

Next, referring to FIG. 11, in one embodiment after removal of the circuit imprint tool from the substrate, the surface conductive material transfer layer areas 64 interconnecting the microtraces 72-77 are removed by applying an etch resist not shown (188) within the grooves 61-63 using a squeegee, abrasive removal of smudged edge resist from the surfaces 64 and open etching to form the circuit 1200 shown in FIG. 12.

In another embodiment the surface areas are selectively removed by a print and etch (190) process thereby forming trace features 81 (FIG. 12a) on the surface of the substrate 80 as well (192). The print and etch process is known to those skilled in the art. The conductive material within the grooves 61 to 63 may be protected during such a print and etch process by first plugging with a squeegeed on etch resist as previously described.

In another embodiment, microvia interconnect between the surface and an inner layer conductive material is formed using a standard desmear (194) and conductive backfill processes (196) familiar to one skilled in the art. The resultant circuit, shown in FIG. 12 includes an inner layer conductive material 1201 that is connected to the surface 1210 of the circuit by connection to the vertical walls 1203, 1204 of an imprinted microvia through a conductive fill material 1209. Non-limiting examples of a conductive fill material 1209 include conductive material formed by desmear, electroless and plating as in conventional printed circuit board manufacturing, conductive adhesives or conductive polymers, conductive material that is applied through other techniques such as vapor deposition, electroless deposition or metal flame deposition all known in the art. The circuit further contains vertical traces 1205, 1206, 1207, 1208 which are all formed simultaneously with the microvias using the imprint process as described above.

In other embodiments, shown in FIG. 12a, the techniques already described can be used to selectively etch surface areas of the circuit 90 leaving surface traces 81, vertical microtraces 72 that connect surface conductive material 81 with inner layer conductive material 65 embedded in the circuit substrate 80, multilayer vertical microtraces 73 that do not connect to an inner layer conductive material, vertical microtraces that are in pairs 74, 75 that may be selectively located over embedded inner layer conductive material 82 and vertical microtraces 76 in which the paired vertical microtrace has been selectively etched away leaving a vertical wall 77.

In another embodiment application of the techniques described create redundant vertical microtraces. The same artwork that is used in manufacturing conventional circuitry with horizontal traces in multiple layers is used to produce the female imprint tool master and from that the male imprint tool. It is seen that for each horizontal trace in the conventional design, there will be produced a pair of vertical traces in the imprint embodiment in which the transfer conductive material layer is removed from the prominences of the male imprint tool prior to transfer lamination to the circuit. Left intact, each pair of vertical traces interconnects the same points as in the conventional design. However now instead of a single horizontal trace there are a pair of vertical microtraces thereby providing a redundant interconnect. Examples of such redundant conductive material are represented in FIG. 12. Microtraces prepared by either the squeegee and etch process previously described or by a selective print and etch process also previously described in which both of the pair of vertical traces is protected by an etch resist will result in redundant pairs. Two sets of such redundant pairs are shown 1205, 1206 represent a redundant pair and 1207, 1208 represent a second redundant pair.

Thus, it is seen there is provided a new and improved method of manufacturing three-dimensional circuits that include high aspect ratio microtraces. Additionally, a number of unique and useful interconnect configurations are possible using combinations of the layers fabricated using the inventive method or in combination with conventional layer configurations.

Figure 13:
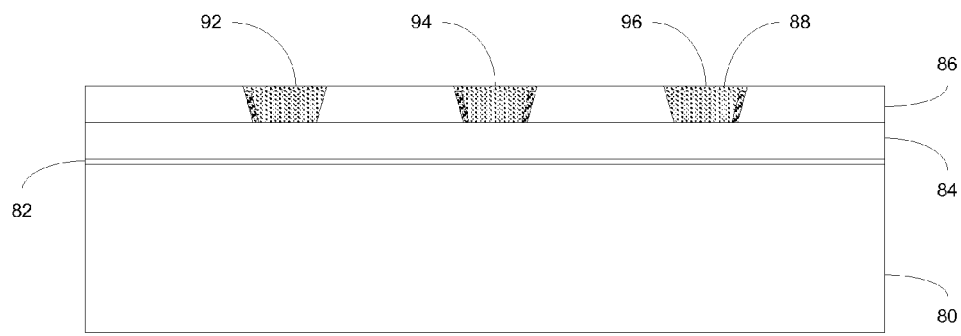
FIG. 13 is a cross sectional view of a two-layer circuit construct in accordance with the present invention showing microstrip transmission line embodiments.

FIG. 13 shows balanced 94 and unbalanced 92, 96 microstrip transmission line embodiments using the microtrace structures imprinted in plastic layer 86 deposited on dielectric layer 84 grown on top of ground plane 82 deposited on substrate 80. Adjustment of the thickness and dielectric constant of the dielectric layer allows the intrinsic impedance of the transmission lines to be adjusted over a wide range. Adjustment of trace separation and the dielectric filler 88 in the balanced structure similarly affects transmission line properties.

Figure 14:
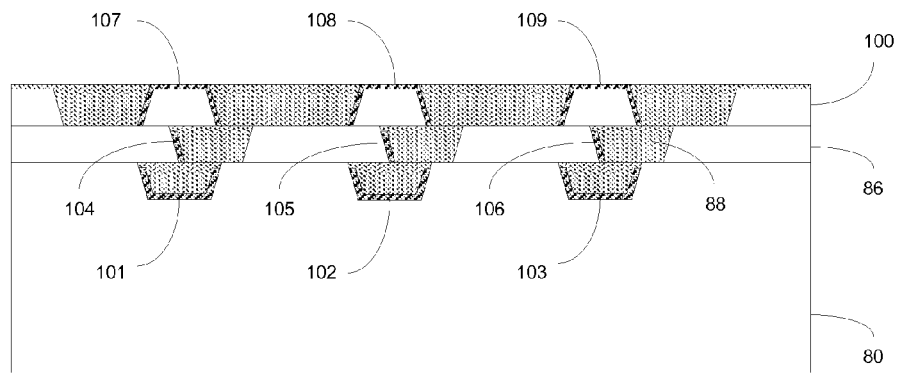
FIG. 14 is a cross sectional view of a four-layer circuit construct in accordance with the present invention showing shielded transmission line structures.

FIG. 14 shows a three-layer circuit embodiment that includes nearly fully enclosed shielded microtraces. Lower shields 101-103 are realized using conventional imprinting techniques to fully coat the imprinted grooves with conductive material. These grooves are backfilled with dielectric 88 and a second plastic layer 86 is attached to the top surface. The inventive method is used to fabricate microtraces that are offset with respect to the first layer pattern to center the middle microtraces 104-106 over the lower shield. After backfilling with dielectric material, a third plastic layer 100 is attached to the composite and the inventive method is again employed to form upper shields 107-109. In another embodiment the fully enclosed shielded microtraces may be intermixed in the same construction with non-shielded microtraces using the technique described above to selective remove conductive material from the prominences through a photolithographic print and etch process.

Figure 15:
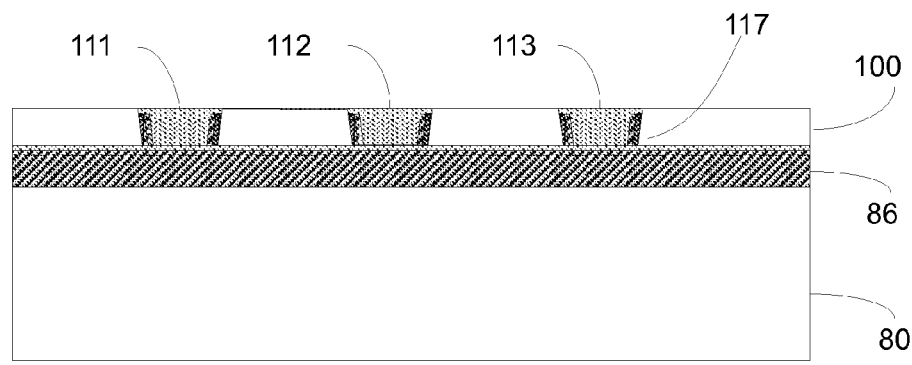
FIG. 15 is a cross sectional view of a two-layer circuit construct in accordance with the present invention showing traces in the second layer that are oriented at right angles with the traces in the first layer.
Figure 16:
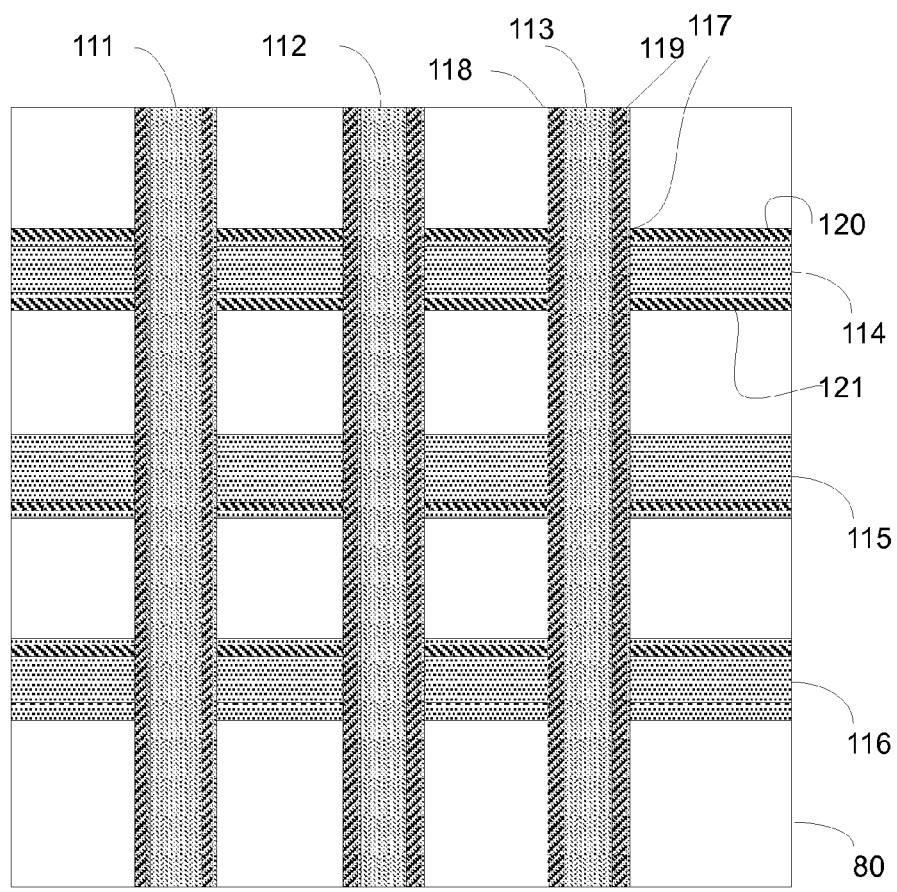
FIG. 16 is a top view of the two-layer circuit shown in FIG. 15.

In another embodiment shown in FIG. 16, a grid electrode structure is fabricated using the inventive method that includes first layer microtraces 114-116 imprinted in substrate 80 beneath second layer microtraces 111-113 fabricated in a second layer. FIG. 15 shows a cross section of the structure which exhibits extremely small fringing capacitance between x- and y-directed microtraces.

Figure 16A:
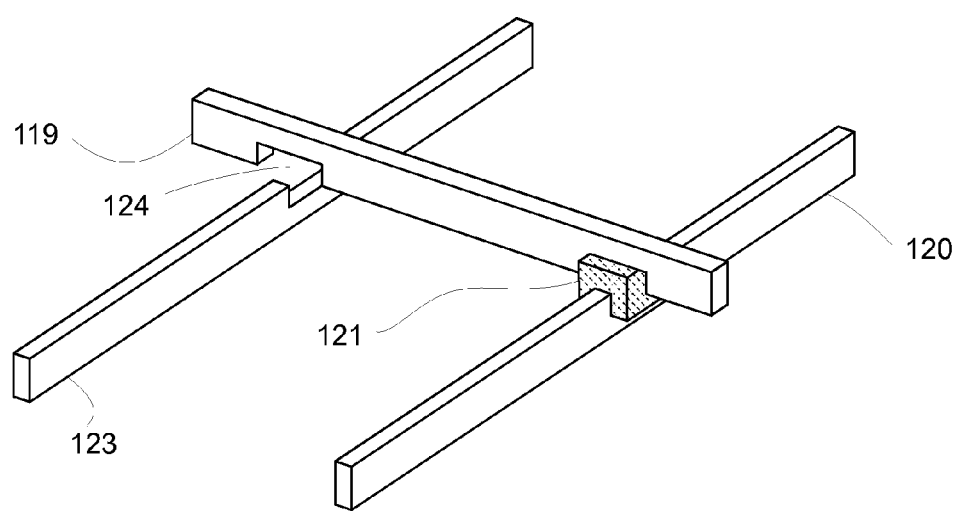
FIG. 16a is a perspective view of an embodiment of the intersection of two traces of FIGS. 15 and 16 in which the traces are electrically interconnected at the intersection.

In another embodiment shown in FIG. 16a, the vertical microtraces crossing in adjacent levels at approximately right angles are selectively interconnected at junctions. In one embodiment a connection is made between crossed vertical microtrace 119 and 120 at the intersection through addition of an interconnect conductive material 121. Non-limiting examples of interconnect conductive material include solder, other malleable metals, conductive adhesive and simple plated protrusions the same conductive material used to make the vertical microtraces 119 and 120. It should be noted that both vertical microtraces 119 and 120 are embedded in a typically dielectric substrate upon which the imprinting is done. Similarly, vertical microtraces 119 and 123 are selectively not connected at the junction 124 by prior selective etching of the transfer conductive material from the imprint tool at the anticipated points of the junction prior to imprinting. The additional process steps required to implement this unique circuit structure are described below and involve the preparation of a thin, separate upper microtrace layer which is subsequently bonded to a lower microtrace layer formed on a thick circuit substrate as described previously.

Figure 19:
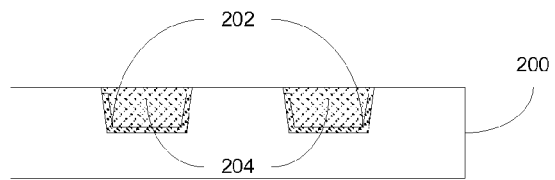
FIG. 19 is a cross sectional view of a circuit constructed in accordance with an embodiment of the present invention in which the imprinted traces have been filled with a resist.
Figure 20:
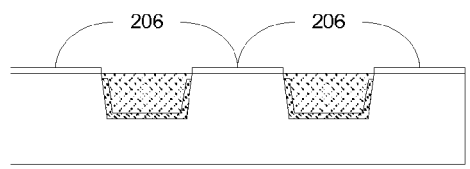
FIG. 20 is a cross sectional view of a circuit constructed in accordance with the present invention wherein the surfaces between traces have been plated with conductive material.
Figure 21:
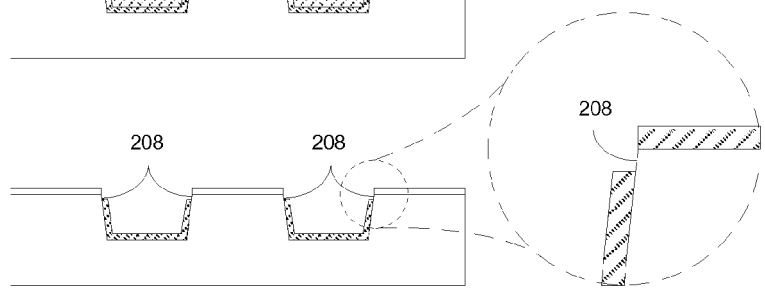
FIG. 21 is a cross sectional view of a circuit constructed in accordance with the present invention wherein the plating resist has been removed and showing the gaps that are created between the imprinted traces and the surface conductive material layer.
Figure 22:
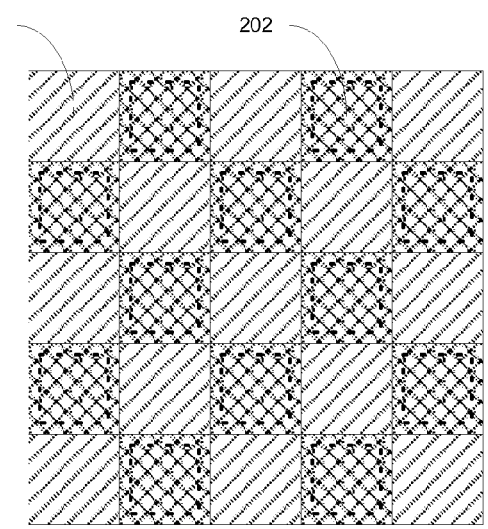
FIG. 22 is a top view of the structure of FIG. 21 showing the two-dimensional checkerboard pattern useful for touch screen applications.

FIG. 19 shows a cross section of an embodiment of a three-dimensional circuit 200 fabricated using the inventive method wherein a two dimensional double level electrode structure is produced wherein the electrodes on different levels are electrically isolated from each other and no gap or overlap exists between the surface projections of electrodes on different levels. In FIG. 19 traces 202 have been coated with conductive material and the intervening surface conductive material has been removed using an etch process that results in the slight vertical etching of the vertical trace conductive material, and the traces have subsequently been backfilled with plating resist 204 applied in one embodiment using a squeegee. Nonlimiting alternative application techniques include photolithography and screen printing. In FIG. 20 the substrate surface is plated to form surface electrodes 206 that are electrically isolated from the traces 202 by gaps 208 inherent in the formation of the traces caused by the lateral etching that accompanies the removal of the original surface conductive material. Note that the gaps 208 formed in the imprinting process also form inherent solder dams that help to confine solder to the trace grooves in the finished circuit. In FIG. 21 the plating resist has been removed resulting in the three-dimensional circuit structure having one possible surface configuration as shown in the top view in FIG. 22. Trace elements 202 and surface elements 206 can be separately interconnected diagonally to form a two dimensional array of capacitive sensors for use in touch screens.

Figure 23:
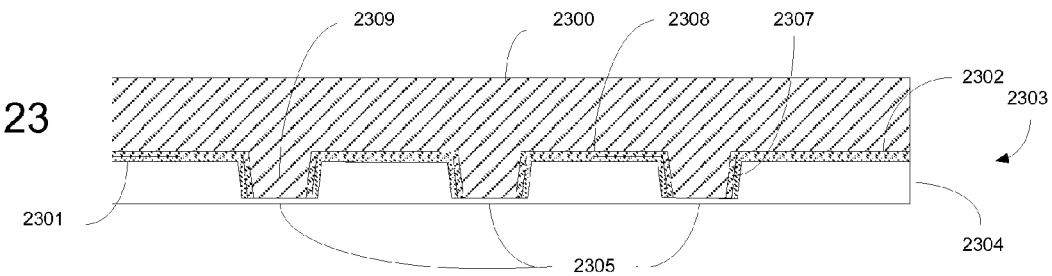
FIG. 23 is cross sectional view of a first step in making vertical traces using an imprint tool.

As shown in FIG. 23, a circuit imprint tool for the upper layer 2300 is placed upon an uncured deformable upper circuit substrate 2304 in a high heat deflecture plastic molding machine, such as a laminating press used in making multilayer circuits (not shown) which under heat and pressure causes a blank 2303 to be formed. Nonlimiting examples of the circuit substrate materials include thermoplastic polymeric material, thermoset material, and uncured ceramics. The conductive material transfer layer 2302 is laminated with the adhesion promotion layer 2301 to the circuit substrate 2304. The conductive material transfer layer is transferred from the circuit imprint tool 2300 to the substrate 2304 creating a conductive material layer both on the surface 2308 of the substrate as well as on the walls 2307 of the grooves formed from the prominences 2309 of the circuit imprint tool. At the nominal pressures experienced in the molding machine a thin web of substrate material 2305 will remain at the tips of the prominences 2309 of the circuit imprint tool.

Figure 24A:
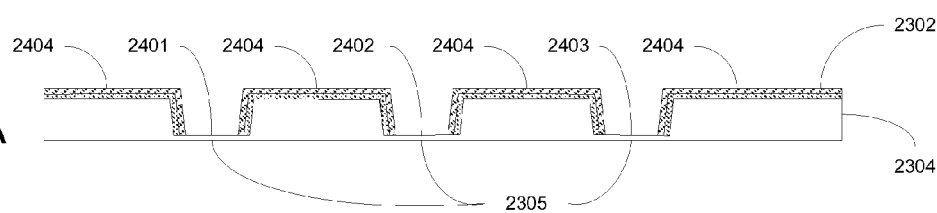
FIG. 24A is a cross sectional view of a second step from FIG. 23 with the imprint tool removed.
Figure 24B:
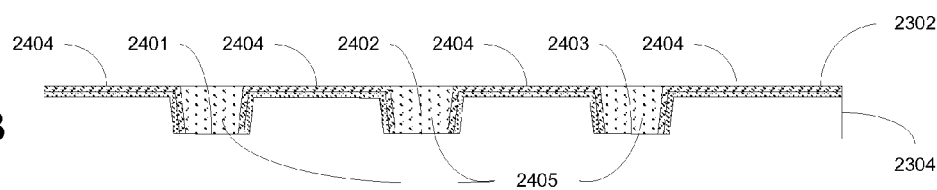
FIG. 24B is a third step with the process starting with FIG. 23 showing the imprint grooves filled with dielectric.
Figure 24C:
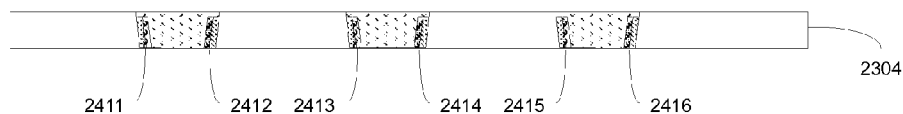
FIG. 24C shows a view of finished vertical traces made by the process starting with FIG. 23.
Figure 25:
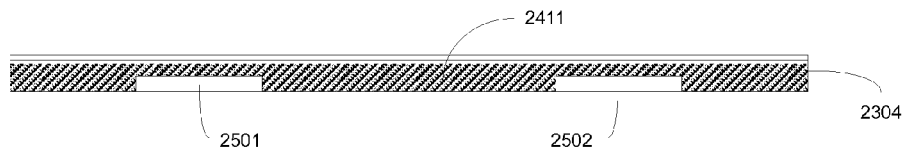
FIG. 25 shows a view of the traces of FIG. 24C rotated 90 degrees.

The circuit imprint tool 2300 may then be removed from the substrate 2304 leaving an upper circuit substrate similar to that shown in FIG. 24a. A permanent dielectric etch resist material 2405 is then applied to fill the grooves 2401, 2402, 2403 in substrate 2304, resulting in the structure shown in FIG. 24b. The dielectric material can be applied, for example, using a squeegee, dry film processing, wet coating or screen printing. The circuit is then subjected to a metal etch which removes the surface conductive material 2404. The thin web of substrate material 2305 is then removed, resulting in the upper circuit substrate illustrated in FIG. 24c containing microtraces 2411-2416. Grooves 2501 and 2502 that align with the microtraces in the lower substrate are etched in the bottom of the upper circuit substrate using standard print and etch methods, as shown in FIG. 25 which illustrates microtrace 2411 in FIG. 24c rotated by 90 degrees.

Figure 26A:
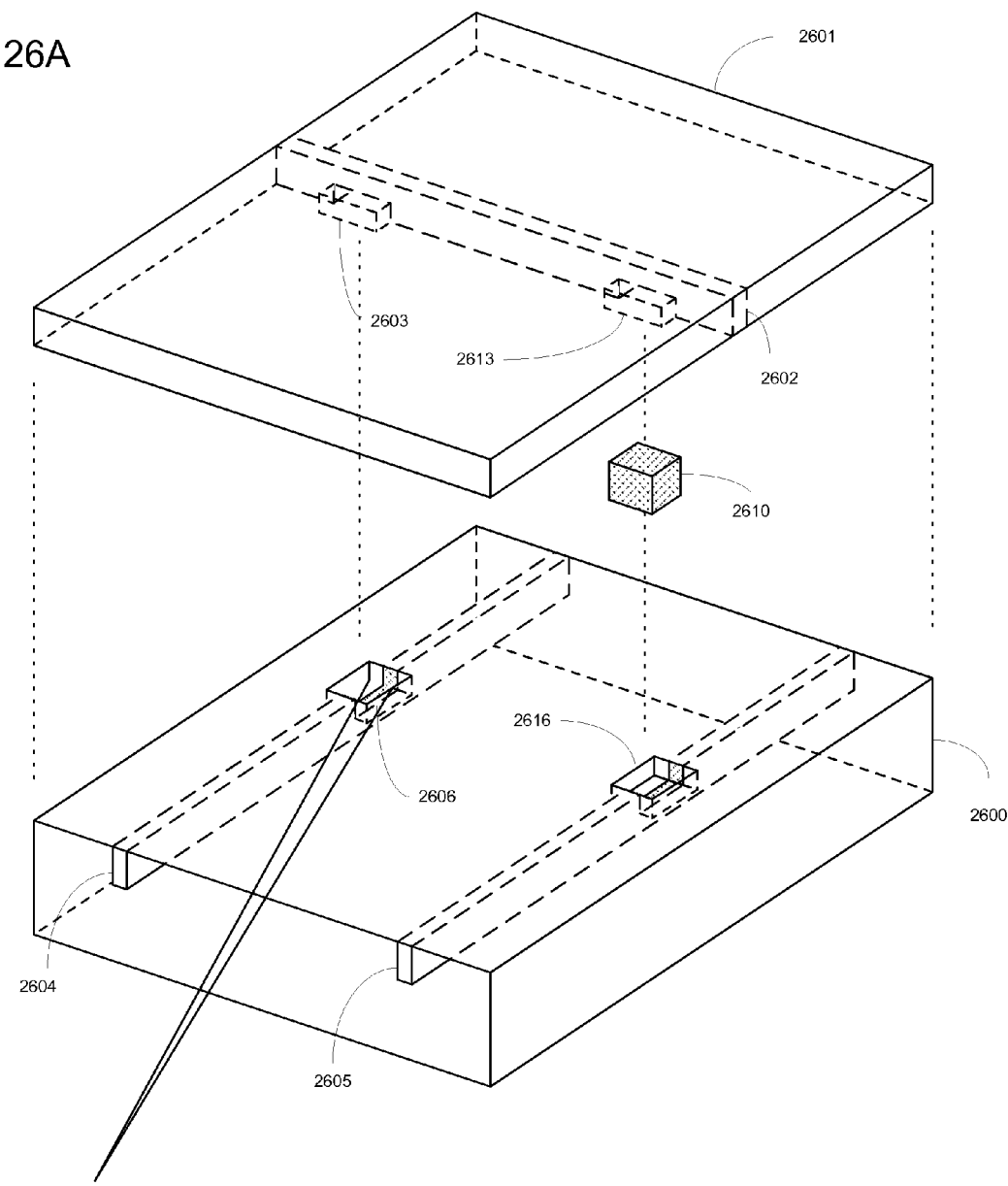
FIG. 26A shows an embodiment for selectively making connections between traces on different layers.
Figure 26B:
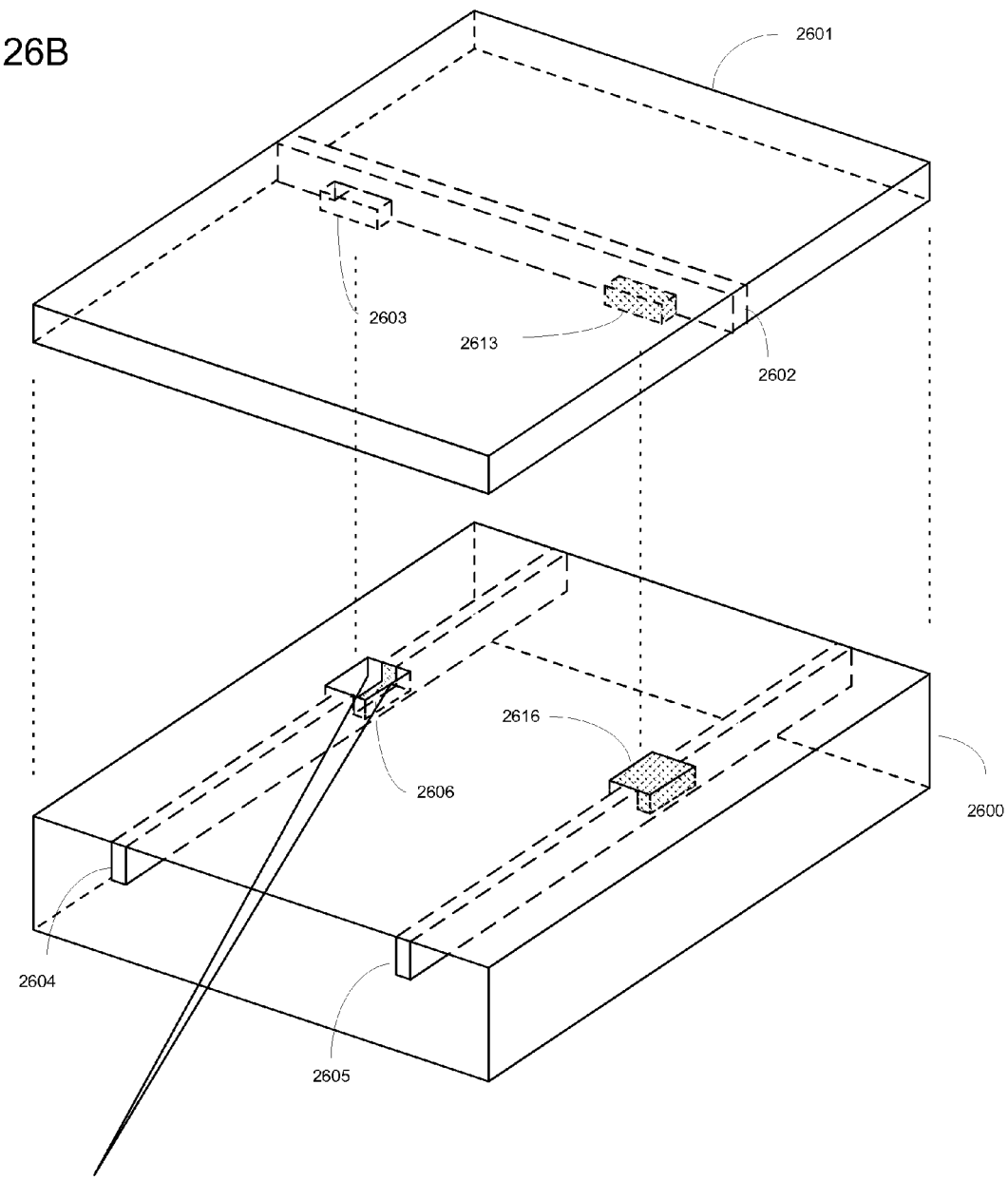
FIG. 26B shows another embodiment for selectively making connections between traces on different layers.
Figure 26C:
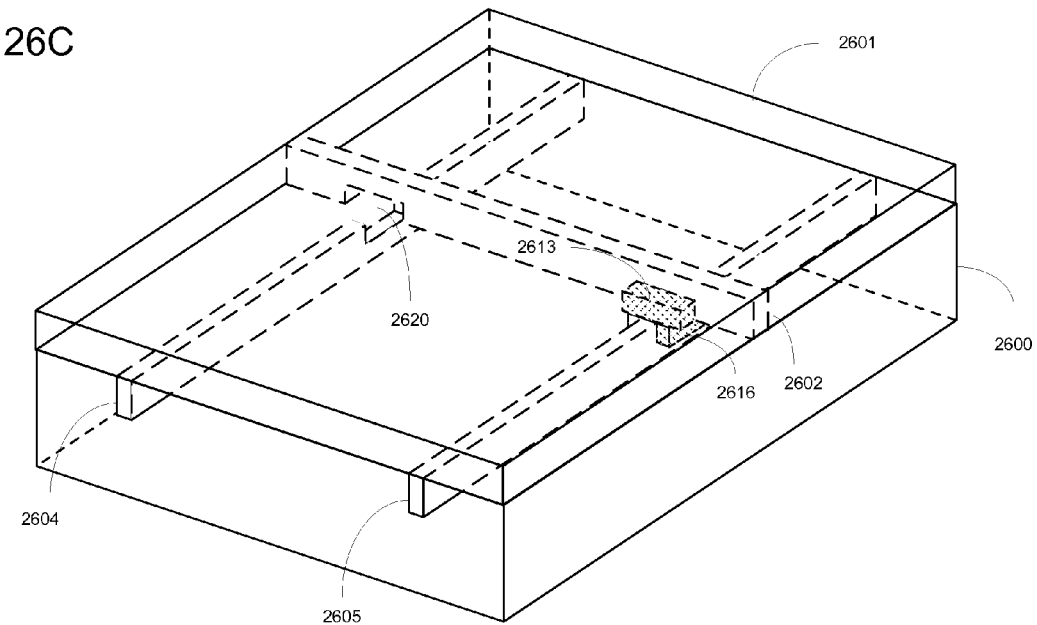
FIG. 26C shows a two layer structure embodiment with selectively interconnected traces.

FIG. 26a shows an exploded view of the two-layer structure in which microtrace 2602 in the upper circuit substrate 2601 is intended to be electrically connected to microtrace 2605 in the lower circuit substrate 2600, but microtrace 2602 is to remain electrically insulated from microtrace 2604 in the lower circuit substrate. Notches 2603 and 2613 are etched in microtrace 2602 using standard print and etch techniques familiar to one skilled in the art, which notches align with notches 2606 and 2616 similarly etched in microtraces 2604 and 2605, respectively. A block of electrically conductive interconnect material 2610 is notionally illustrated to show how microtraces 2602 and 2605 are to be interconnected. FIG. 26b shows etched notches 2613 and 2616 filled with a conductive material such as solder paste that will be joined to effect the interconnection between microtraces 2602 and 2605. Etched notches 2603 and 2606 are either unfilled or, optionally, filled with a dielectric material to maintain the electrical isolation of microtraces 2602 and 2604. FIG. 26c shows the integrated assembly in which the conductive material filling etched notches 2613 and 2616 has coalesced to effect the electrical connection of microtraces 2602 and 2605. The air- or dielectric-filled notches 2603 and 2606 (not shown for clarity) between microtraces 2602 and 2604 form the cavity 2620 that maintains the electrical isolation of microtraces 2602 and 2604.

SUMMARY

Imprinting tools and processes for making such tools, circuitry that includes narrow, high aspect ratio traces having reduced parasitic capacitance to adjacent circuit features and processes for making such circuitry using the imprinting tools are described. Those skilled in the art will appreciate that various adaptations and modifications of the preferred embodiments can be configured without departing from the scope and spirit of the invention. Therefore, it is to be understood that the invention may be practiced other than as specifically described herein, within the scope of the appended claims.

What is claimed is:

1. A method of making a three dimensional circuit, comprising:
   a) forming a three dimensional male circuit imprint tool having a removable coating of conductive material on a surface having prominences;
   b) coating said conductive material with a thin layer of a highly adherent material;
   c) selectively removing said adherent material and said conductive material coating from prominences on said three dimensional male circuit imprint tool, wherein selectively removing said conductive material coating from prominences is accomplished using either mechanical abrasion or chemical etching, d) pressing said three dimensional male circuit imprint tool into a deformable plastic material to deform the plastic material and transfer the removable conductive material coating to the deformable plastic material resulting in a substrate having a surface with a plurality of conductively coated indentations disposed therein where said indentation are at least one selected from grooves and pits;

e) admitting to said plurality of conductively coated indentations an etch resistant material; and f) etching a desired electrical circuit pattern in the surface of said conductive material.

2. A method of making a three dimensional circuit according to claim 1, wherein the removable conductive material coating is at least one selected material selected from: nickel, copper, gold, and indium tin oxide (ITO).

3. A method of making a three dimensional circuit according to claim 1, wherein said step of forming three dimensional male circuit imprint tool comprises formation from a predecessor female tool.

4. A method of making a three dimensional circuit according to claim 3, wherein said step of forming a male circuit imprint tool comprises:

a) coating said female predecessor master tool with a low adhesion material;

b) depositing a thin layer of conductive material on the coated female processor master tool; and c) separating said thin layer of conductive material from said female predecessor master tool to form the three dimensional male circuit imprint tool.

5. A method of making a three dimensional circuit according to claim 3, wherein said step of forming a male circuit imprint tool comprises:

a) coating said female predecessor master tool with a low adhesion material;

b) depositing a thin layer of conductive material on the coated female processor master tool;

c) attaching a layer of backing material to the layer of conductive material; and d) separating said backing layer and said thin layer of conductive material from said female predecessor master tool to form the three dimensional male circuit imprint tool.

6. The method of claim 5 wherein the backing material comprises a metal layer electroplated on the thin layer of conductive material.

7. The method of claim 5 wherein the backing material comprises a plastic layer molded or laminated to the thin layer of conductive material.

8. A method of making a three dimensional circuit according to claim 1, wherein said step of forming a male circuit imprint tool comprises direct formation in a blank of circuit imprint material.

9. A method of making a three dimensional circuit according to claim 8, wherein direct formation comprises photolithography and chemical etching.

10. A method of making a three dimensional circuit according to claim 8, wherein direct formation comprises photolithography and electroforming.

11. A method of making a three dimensional circuit according to claim 1, wherein said highly adherent material is an oxide of the material primarily forming the removable conductive coating.

12. A method of making a three dimensional circuit according to claim 4 or claim 5, wherein said low adhesion material is silver, a graphite material or surface passivation.

13. A method of making a three dimensional circuit according to claim 1, wherein said step of admitting includes removing selectively a sufficient quantity of said etch resistant material from individual ones of the grooves to expose the conductive material surface in a top portion thereof.

14. A method of making a three dimensional circuit according to claim 13, wherein the step of etching a pattern in said conductive material includes removing the exposed conductive material surface from the top portion of the selected individual ones of the grooves to form spaces between the top surface of the resulting circuit and the top portions of the grooves to define solder dams within said grooves.

15. A method of making a three dimensional circuit according to claim 1, wherein said step of pressing includes:

a) heating said plastic material to a sufficient temperature to enable the material to deform under pressure;

b) stamping said plastic material with said male circuit imprint tool;

c) whereby a substrate blank is formed having a plurality of indentations coated with conductive material disposed within the surface thereof where said indentations are at least one selected from grooves and pits.

16. A method of making a three dimensional circuit according to claim 15, wherein said plastic material is a thermoplastic material.

17. A method according to claim 16, wherein said thermoplastic material is a platable thermoplastic material selected from the group of polyethersulphone, polyetherimide, polybutylene terephthalate (PBT), or polyether ether ketone (PEEK).

18. A method according to claim 15, wherein said plastic material is a thermoset plastic, such as epoxy thermoset polyetherimide, or a polyester based composite of said thermoset plastic.

* * * * *